(12) United States Patent
Forstner et al.

(10) Patent No.: US 7,190,220 B2
(45) Date of Patent: Mar. 13, 2007

(54) CIRCUIT FOR PROVIDING A BASE OPERATING VOLTAGE FOR A BIPOLAR TRANSISTOR AND AMPLIFIER CIRCUIT

(75) Inventors: Johann-Peter Forstner, Steinhöring (DE); Stephan Weber, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/032,693

(22) Filed: Jan. 10, 2005

(65) Prior Publication Data

US 2006/0006948 A1    Jan. 12, 2006

Related U.S. Application Data

(63) Continuation of application No. PCT/EP03/07340, filed on Jul. 8, 2003.

(30) Foreign Application Priority Data

Jul. 10, 2002    (DE) ................. 102 31 156

(51) Int. Cl.
H03G 5/16    (2006.01)
(52) U.S. Cl. ............... 330/133; 330/296; 330/297; 330/289; 330/310; 327/306
(58) Field of Classification Search ............. 330/296, 330/297, 289, 133, 134, 310; 327/306, 307, 327/308
See application file for complete search history.

(56) References Cited

U.S. PATENT DOCUMENTS

| 3,896,393 | A | 7/1975 | Cave et al. |
| 3,995,228 | A | 11/1976 | Pass |
| 6,043,714 | A | 3/2000 | Yamamoto et al. |
| 6,236,266 | B1 | 5/2001 | Choumei et al. |
| 6,359,516 | B1 | 3/2002 | Luo et al. |
| 6,414,553 | B1 | 7/2002 | Luo |

FOREIGN PATENT DOCUMENTS

| DE | 198 21 735 A1 | 6/1999 |
| DE | 100 00 486 A1 | 12/2000 |
| JP | 07336158 | 12/1995 |

OTHER PUBLICATIONS

Millman "Micro-electronics" McGraw-Hill copyright 1979 p. 69.*
Riedl, A., "PA-300", Elektor Elektronic Journal, No. 11, XP-002258125, Nov. 1995, pp. 20-27, (8 pages).

* cited by examiner

Primary Examiner—Michael B Shingleton
(74) Attorney, Agent, or Firm—Maginot, Moore & Beck LLP

(57) ABSTRACT

A circuit for providing a base operating voltage for a bipolar transistor includes a $U_{BE}$ multiplier providing, in response to a working-point control current, a working voltage fed to a circuit for reducing the working voltage in order to generate a base operating voltage smaller than a base-emitter voltage drop of a bipolar power transistor. With this, the bipolar power transistor may be maintained in the class C operation in a flexible and robust manner, so that an amplifier with high efficiency is obtained.

19 Claims, 3 Drawing Sheets

C OPERATION: BASE OPERATING VOLTAGE $U_2 < U_{BE}$

CIRCUIT FOR PROVIDING A BASE OPERATING VOLTAGE FOR A BIPOLAR TRANSISTOR AND AMPLIFIER CIRCUIT

CROSS-REFERENCE TO RELATED APPLICATION

This application is a continuation of co-pending International Application No. PCT/EP03/07340, filed Jul. 8, 2003, which designated the United States and was not published in English and is incorporated herein by reference in its entirety.

BACKGROUND OF THE INVENTION

1. Field of the Invention

The present invention relates to electric power amplifier stages, and in particular to electronic power amplifier stages with bipolar transistors.

2. Description of the Related Art

Electronic power amplifier stages are often constructed with bipolar transistors. These are sensitive to overload, with the robustness decreasing at high operating voltages or temperatures. Furthermore, the connection of the base of the power amplifier by polar transistors plays an important role.

If no protective measures are taken, an amplifier often has to be overdimensioned unnecessarily, which mostly entails significant disadvantages regarding the costs, the amplification and the efficiency etc. The working-point adjustment, in particular, plays an important role for the operating properties of the amplifier. Moreover, the working-point adjustment is supposed to be flexible, for example adjustable via an external voltage or an external current.

FIG. 3 shows a known solution with current mirrors, which have the advantage that they work in a temperature-stable manner. A signal to be amplified, which is illustrated by a signal source 30, is coupled to a base 32a of a power amplifier 32 via a coupling capacitor 31. In the embodiment shown in FIG. 3, the power amplifier 32 is embodied as npn bipolar transistor. The amplified signal is present at a collector 32b of the power amplifier 32. An emitter 32c of the bipolar transistor is connected to a reference potential, such as the ground potential. The power amplifier transistor 32 is supplied with current from a supply voltage $V_{CC}$, wherein the supply current is fed via an inductance 33 or generally via a low pass to the transistor 32. For the current control, the current mirror arrangement of FIG. 3 is provided, having, on the base side, a current source 32, an npn transistor 35, and a short line 36 connecting the base of the transistor 35 to the collector of the transistor 35. The emitter of the transistor 35 is connected to the ground potential, as it is illustrated in FIG. 3.

It is disadvantageous in the current mirror solution shown in FIG. 3 that a class C operation is difficult to realize. The class C operation, however, is particularly attractive especially for RF amplifiers, that are battery-operated, such as in a mobile telephone, owing to the high efficiency. For optimum C operation, which distinguishes itself by a small current flow angle but still sufficiently high amplification, the base operating voltage or base bias voltage would have to be relatively small and be in the range of typically 0.3 to 0.5 V, taking a temperature dependence into account. The current mirror solution shown in FIG. 3, however, only permits base operating voltages in the range of 0.6 to 0.8 V.

Furthermore, there is another difficulty in that, with npn bipolar transistors as power transistors, in the breakdown case, a current, which is to be derived in a low-ohmic manner to the reference potential, i.e. to the ground, flows from the base. This breakdown case is often contingent on high operating voltages $V_{CC}$ or on mismatches.

SUMMARY OF THE INVENTION

It is the object of the present invention to provide a circuit for providing a base operating voltage for a bipolar transistor as well as an amplifier circuit, by which a well-to-handle class C operation of the bipolar power transistor becomes possible.

In accordance with a first aspect, the present invention provides a circuit for providing a base operating voltage for a bipolar transistor, having a base-emitter voltage multiplier with a multiplier transistor for providing a working voltage as a reaction to a working-point control current, wherein the working voltage is equal to a base-emitter voltage drop of the multiplier transistor multiplied by a voltage amplification factor, wherein the voltage amplification factor is greater than 1; a circuit for reducing the working voltage to the base operating voltage, which is smaller than a base-emitter voltage drop of the bipolar transistor, wherein the circuit for reducing the working voltage to the base operating voltage has an emitter follower transistor for buffering the working voltage and for reducing the working voltage by a base-emitter voltage drop of the emitter follower transistor.

In accordance with a second aspect, the present invention provides an amplifier circuit, having a bipolar transistor with a base, a collector, and an emitter; a circuit for providing a base operating voltage for the bipolar transistor, having a base-emitter voltage multiplier with a multiplier transistor for providing a working voltage as a reaction to a working-point control current, wherein the working voltage is equal to a base-emitter voltage drop of the multiplier transistor multiplied by a voltage amplification factor, wherein the voltage amplification factor is greater than 1; a circuit for reducing the working voltage to the base operating voltage, which is smaller than a base-emitter voltage drop of the bipolar transistor, wherein the circuit for reducing the working voltage to the base operating voltage has an emitter follower transistor for buffering the working voltage and for reducing the working voltage by a base-emitter voltage drop of the emitter follower transistor; wherein the collector of the bipolar transistor may be coupled to a supply voltage, wherein the base of the bipolar transistor may be coupled to a signal to be amplified as well as the base operating voltage, wherein the emitter of the bipolar transistor may be coupled to a reference voltage potential, and wherein an amplified signal may be output at the collector of the bipolar transistor.

The present invention is based on the finding that, for a class C operation of the power amplifier transistor, adjustable base operating voltages have to be fed, which are significantly smaller than a base-emitter voltage drop of the transistor. The base-emitter voltage drop corresponds to the so-called "gate or threshold voltage" of the base-emitter diode, which lies at about 0.6 V when the transistor is embodied from silicon. In germanium transistors, this value is about 0.3 V, and in gallium arsenide (GaAs) transistors it is at 1.4 V.

According to the invention, thus at first a multiple of the base-emitter voltage is generated by means of a base-emitter voltage multiplier as a reaction to a working-point control current in order to obtain a working voltage resulting from the base-emitter voltage drop multiplied by a voltage amplification factor x, the voltage amplification factor x being greater than 1. The working voltage is thus in any case greater than a base-emitter voltage drop, with the measure, by how much greater the working voltage is, being adjustable by the voltage amplification factor. A circuit for reducing the working voltage to a base operating voltage is connected downstream to the base-emitter voltage multiplier circuit, wherein the circuit for reducing the working voltage generates a base operating voltage smaller than the base-emitter voltage drop of the bipolar transistor.

By the inventive generating of at first an actually too great voltage in order to then obtain a voltage with correct amount with a voltage reduction circuit, which is significantly smaller than a base-emitter voltage drop and lies in the range of 0.3 to 0.5 V in silicon, there is high flexibility regarding adjustability, handling capacity, and freedom of design. If the voltage amplification factor x is chosen in the range of 1.4 to 2, and when a simple emitter follower in which a base-emitter voltage drop occurs is used as circuit for reducing the working voltages, the base operating voltage at the output of the emitter follower is in the desired range, i.e. smaller than the base-emitter voltage drop. Due to the properties of the emitter follower, the voltage, however, is now present in buffered manner and thus favorably for the operating properties of the power transistor.

In a preferred embodiment of the present invention, the circuit for reducing the working voltage includes, apart from the emitter follower, a further base-emitter voltage multiplier circuit, which is, however, dimensioned such that the base operating voltage at the output of the circuit for reducing is smaller than a base-emitter voltage drop, as it is required for the class C operation.

Preferred embodiments of the present invention distinguish themselves in particular by having a low internal additional current only minimally reducing the efficiency of the active amplifier. Furthermore, due to the high freedom of design, temperature stabilization can be easily implemented.

Furthermore, the circuit according to the invention may easily be supplemented by a simple compensation circuit in order to also ensure stable operation with strongly varying supply voltages. Strongly varying supply voltages, for example, are present in mobile devices in which the battery provides a high voltage when strongly charged and a lower voltage the closer it is to its lower charging state. The preferred compensation circuit ensures that the power transistor is operated more strongly in the C operation at a high operating voltage, i.e. has smaller base operating voltages than in the case in which the supply voltage has already dropped. In this case, for balancing this fact, the base operating voltage of the transistor is controlled more closely toward the base-emitter voltage drop in order to compensate a power drop in the output power of the power transistor, since only a "loose" class C operation (closer to class B) is present.

An advantage of the present invention thus further consists in the fact that the system properties, such as the output power, become relatively independent of $V_{CC}$ and T at high efficiency.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
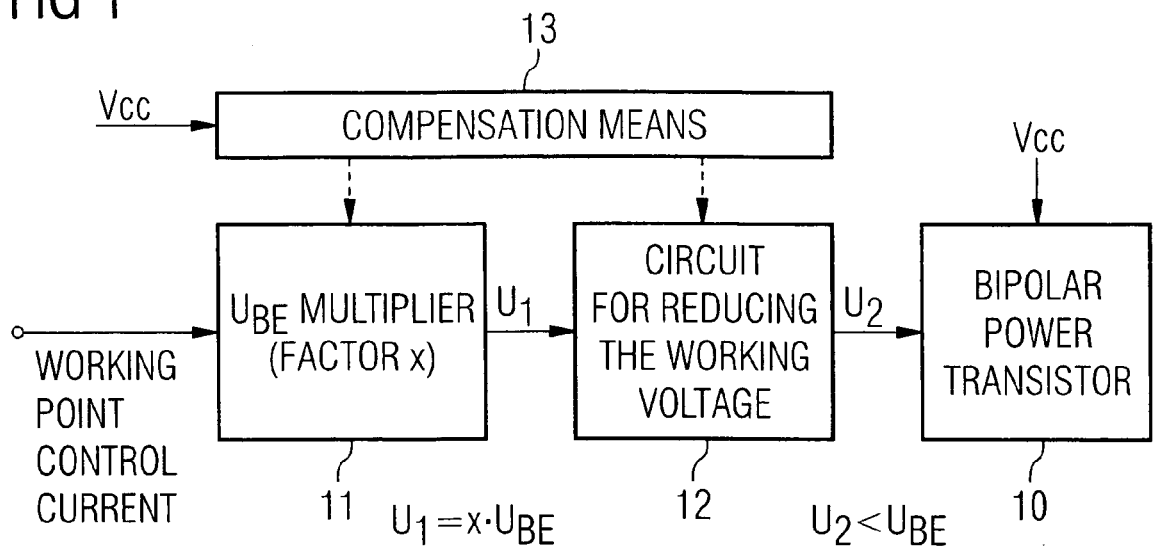
FIG. 1 is a block circuit diagram of an inventive circuit for providing a base operating voltage for a bipolar transistor.
Figure 3:
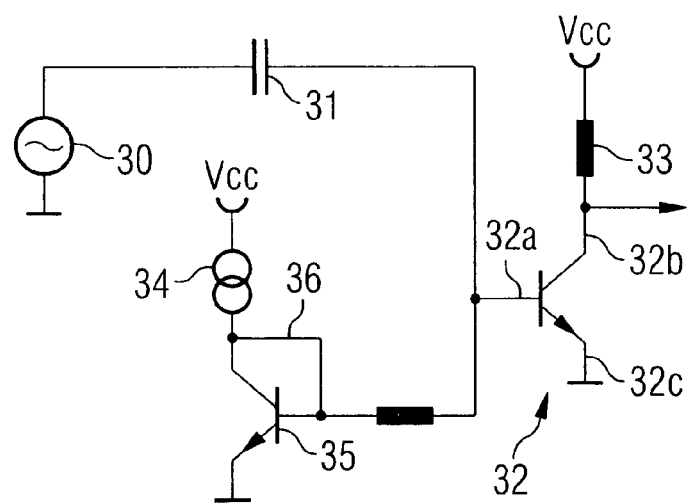
FIG. 3 is a circuit diagram of a known base operating voltage adjustment circuit.

FIG. 1 shows a circuit for providing a base operating voltage $U_2$ for a bipolar transistor 10. In response to a working-point control current, which, as will be set forth later, can be generated from a control voltage, a UBE multiplier 11 generates a working voltage $U_1$, which is greater than a base-emitter voltage drop of a multiplier transistor included in the multiplier circuit 11 by a voltage amplification factor x. The voltage amplification factor x preferably lies in the range of 1.4 to 2 and is adjustable, as it will be explained in the following on the basis of FIG. 2.

Downstream to the $U_{BE}$ multiplier, a circuit 12 for reducing the working voltage $U_1$ to the base operating voltage $U_2$ is provided, which is smaller than a base-emitter voltage drop of the bipolar power transistor 10 to enable class C operation.

When the transmission characteristic curve field of a bipolar transistor is considered, the collector current between a base-emitter voltage of 0 V to about a base-emitter voltage drop, i.e. the "gate voltage", is relatively small and then surges according to the exponential characteristic curve. In the class C operation, the base operating voltage is chosen smaller than the gate voltage so that only at certain phases of the input signal to be amplified a strong collector current flows. The phases in which a strong collector current flows, i.e. in which the transistor is "driven open", are also referred to as current flow angles in the art. If the transistor is maintained in the "strong" C class operation, the current flow angle is only relatively small. Such an operation is worthwhile when the supply voltage of the power transistor is high, i.e. when the battery has a good charging condition. Yet, if the charging condition of the battery for example in a mobile end device wanes, output power of the amplifier also decreases with it. This power drop may be countered by a compensation circuit according to the invention within certain limits in that the base operating voltage is controlled more closely toward the base-emitter voltage drop, so that the current flow angle is increased to obtain desired output power specifications. The compensation means 13 is thus formed to act on either the UBE multiplier 11 or on the circuit 12 for reducing the working voltage or on both the circuit 11 and the circuit 12, in order to control the base operating voltage $U_2$ depending on the supply voltage $V_{CC}$, as it will be explained in the following.

Figure 2:
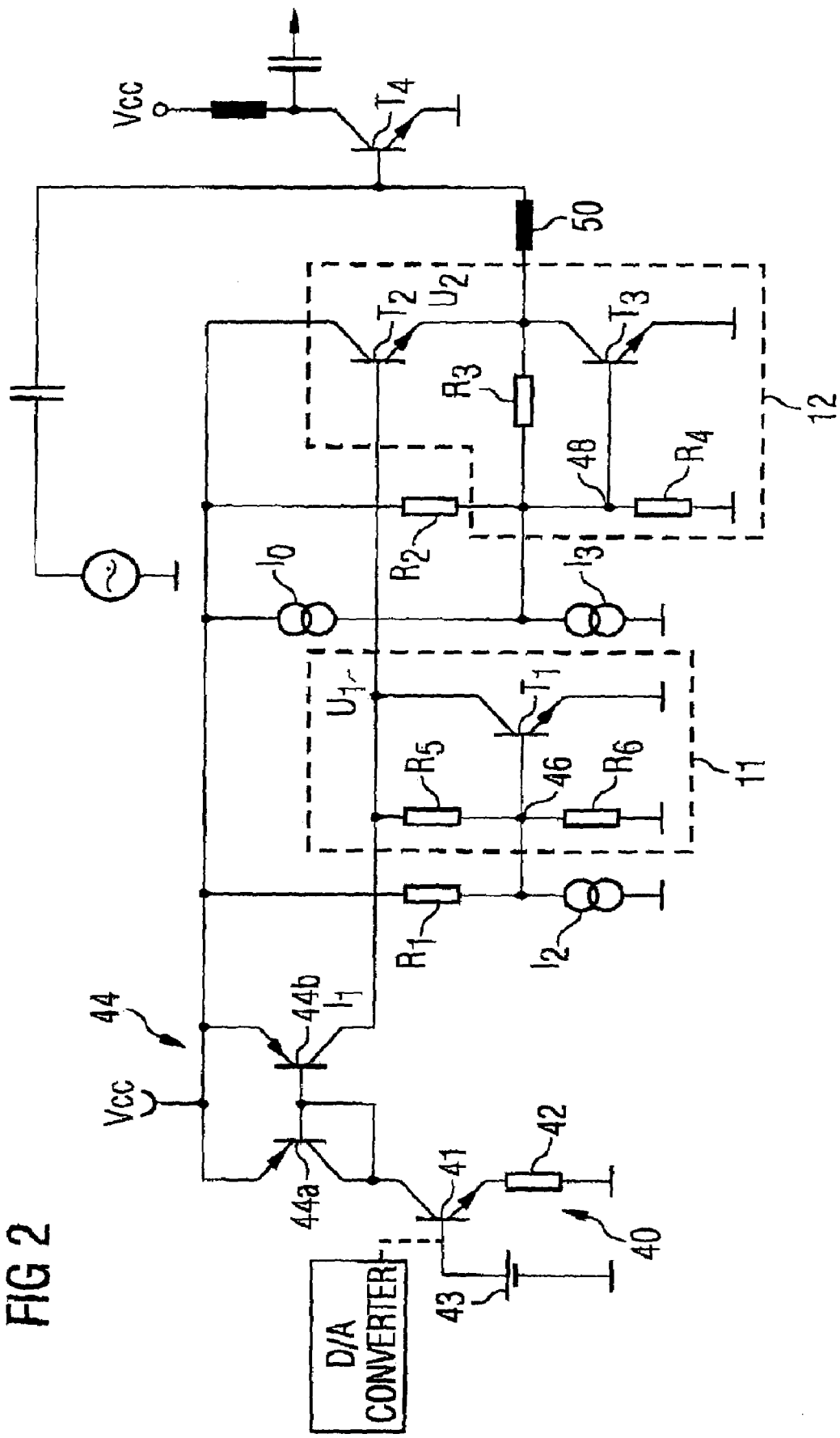
FIG. 2 is a block circuit diagram of a preferred embodiment of the present invention.

Subsequently, on the basis of FIG. 2, a preferred embodiment of the inventive circuit for providing a base operating voltage for a bipolar transistor is illustrated. The working-point control current $I_1$ is provided by a U/I converter 40 consisting of a converter transistor 41 and an emitter resistor for this converter transistor 41, which is designated with 42 in FIG. 2. A control voltage is applied to a base of the converter transistor 41, wherein this control voltage is illustrated symbolically at 43 in FIG. 2, and, in the real circuit, is a voltage present at the output of a digital/analog converter, which is directly applied to the base of the converter transistor 41. The U/I converter circuit 40 leads to the fact that a collector current flows to the ground. This collector current is mapped to the working-point control current $I_1$ according to a pnp current mirror 44 fed by the supply voltage $V_{cc}$.

The pnp current mirror consists of two pnp transistors 44a, 44b the emitters of which are connected to the supply voltage $V_{CC}$, the base terminals of which are connected to each other, and wherein the collector and base of the mirror transistor 44a are shorted in order to in some way achieve a current polarity reversal of the emitter current through the transistor 41 to obtain the working-point control current $I_1$.

The working-point control current $I_1$ is applied to the base-emitter current multiplier 11, which comprises, apart from a multiplier transistor T1, two resistors $R_5$ and $R_6$, which form a voltage splitter. In detail, the multiplier transistor $T_1$ has an emitter connected to a ground potential and a collector at which the working voltage $U_1$ is present. The base of the multiplier transistor is connected to an intermediate node 46, wherein the resistor $R_5$ is connected between the intermediate node 46 and the collector of the multiplier transistor $T_1$, and wherein the resistor $R_6$ is connected between the intermediate node 46 and ground. Optionally, a compensation resistor $R_1$ is also connected between the supply voltage $V_{CC}$ and the intermediate node. Also optionally, a current source $I_2$ preferably employed for temperature compensation is connected between the intermediate node 46 and ground.

The circuit for reducing the working voltage includes, in a first embodiment, only the emitter follower $T_2$, the base of which is connected to the collector of the multiplier transistor $T_1$, the collector of which is connected to $V_{CC}$, and at the emitter of which the base operating voltage $U_2$ with which the power amplifier transistor $T_4$ is supplied regarding the working-point is present. The voltage $U_2$ is then smaller than a base-emitter voltage drop due to the base-emitter voltage drop of the emitter follower transistor $T_2$, when the amplification factor of the $U_{BE}$ multiplier was greater than 1 and smaller than 2, as it will be set forth in the following.

For reasons set forth later, the circuit 12 for reducing the working voltage $U_1$ to the base operating voltage $U_2$ further includes a further $U_{BE}$ multiplier consisting of a multiplication transistor $T_3$ and the two voltage splitter resistors $R_3$ and $R_4$, wherein the base of the further multiplier transistor $T_3$ is connected to a further intermediate node 48. The emitter of the further multiplier transistor $T_3$ lies at ground, and the base operating voltage $U_2$ is present at the collector of the further multiplier transistor $T_3$. The voltage splitter resistor $R_2$ is connected between the intermediate node 48 and the collector of the multiplier transistor, whereas the second voltage splitter resistor $R_4$ is connected between the intermediate node 48 and ground.

For compensation reasons, also a further compensation resistor $R_2$ may be present between the intermediate node 48 and $V_{CC}$, as well as optionally a current source $I_0$ connected in parallel thereto. For temperature compensation reasons, also a further current source, which is designated with $I_3$ in FIG. 2, is preferred between the intermediate node 48 and the ground potential.

The base operating voltage is supplied via a serial inductance 50 to a base of the amplifier transistor $T_4$. The emitter of the amplifier transistor $T_4$ lies at ground, and the collector of the amplifier transistor is connected to $V_{CC}$ (via an inductance) and (via a capacity) to an amplifier output. Moreover, the signal to be amplified is supplied to the base of the amplifier transistor $T_4$ via a high pass, which is illustrated by a capacity.

Subsequently, the functioning of the circuit illustrated in FIG. 2 will be illustrated. At first, the voltage-current converter 40 is provided, which here exemplarily comprises a npn transistor, which is coupled to the pnp current mirror 44, as it is shown in FIG. 2.

Regarding the $U_{BE}$ multiplier, a voltage amplification factor x is defined according to the following equation:

$$U_1 = x \cdot U_{BE},$$

wherein x typically lies between 1.4 and 2 and is approximately calculated as follows:

$$x \approx R_5/R_6 + 1.$$

For the considerations of the $U_{BE}$ multiplication, the influence of $R_1$ and $I_2$ is neglected at first.

The emitter follower $T_2$ buffers the working voltage $U_1$ and reduces it, at has been set forth, by an emitter-base voltage drop $U_{BE}$. The amplifier $T_4$ is then, on the base side, supplied with the base operating voltage $U_2$, which is calculated as follows:

$$U_2 = U_1 - U_{BE} = (x-1) \cdot U_{BE}.$$

The $U_{BE}$ multiplier with downstream emitter follower thus permits voltages smaller than $U_{BE}$, as they are required for the class C operation.

Without the presence of the further multiplier transistor $T_3$, a collector-base breakthrough current could not be forwarded to ground. Instead of the transistor $T_3$, in principle also a resistor or any other current path could be provided, but this current path would have to be dimensioned in a very low-ohmic manner to achieve the same effect. Solutions other than the transistor $T_3$, however, have the disadvantage of a high transverse current causing efficiency loss, which is problematic in so far as the class C operation is chosen just due to the good efficiency.

Also the transistor $T_3$ is in some way also connected as UBE multiplier using the current splitter resistors $R_3$, the optional current source $I_0$ and the resistor $R_3$ provide for the output voltage $U_2$ being smaller than a base-emitter voltage drop $U_{BE}$, which becomes obvious from the following equation:

$$U_2 = U_{BE} - I_{R3} \cdot R_3 < U_{BE},$$

wherein for the current $I_{R3}$ through the resistor $R_3$ the following connection applies (the influence of $I_3$ is neglected):

$$I_{R3} = I_0 + (V_{CC} - U_{BE})/R_2 - U_{BE}/R_4.$$

The compensation transistors $R_1$ and $R_2$ are provided, so that at a high operating voltage $V_{CC}$ the base operating voltage $U_2$ decreases, or that, conversely, at low operating voltages $V_{CC}$ the base operating voltage $U_2$ increases, as it is required for a robust class C operation. In particular, the current flow angle and the loss power at high battery supply voltages $V_{CC}$ are reduced, while working more closely to the class AB working-point at smaller battery operating voltages.

The current source of $I_2$ and $I_3$ provide further degrees of freedom for adjusting further parameters of the circuit, such as influencing the temperature coefficient of the circuit.

The currents of the individual transistors may, as it is known in the art, be adjusted by variation of the transistor sizes.

Figure 4:
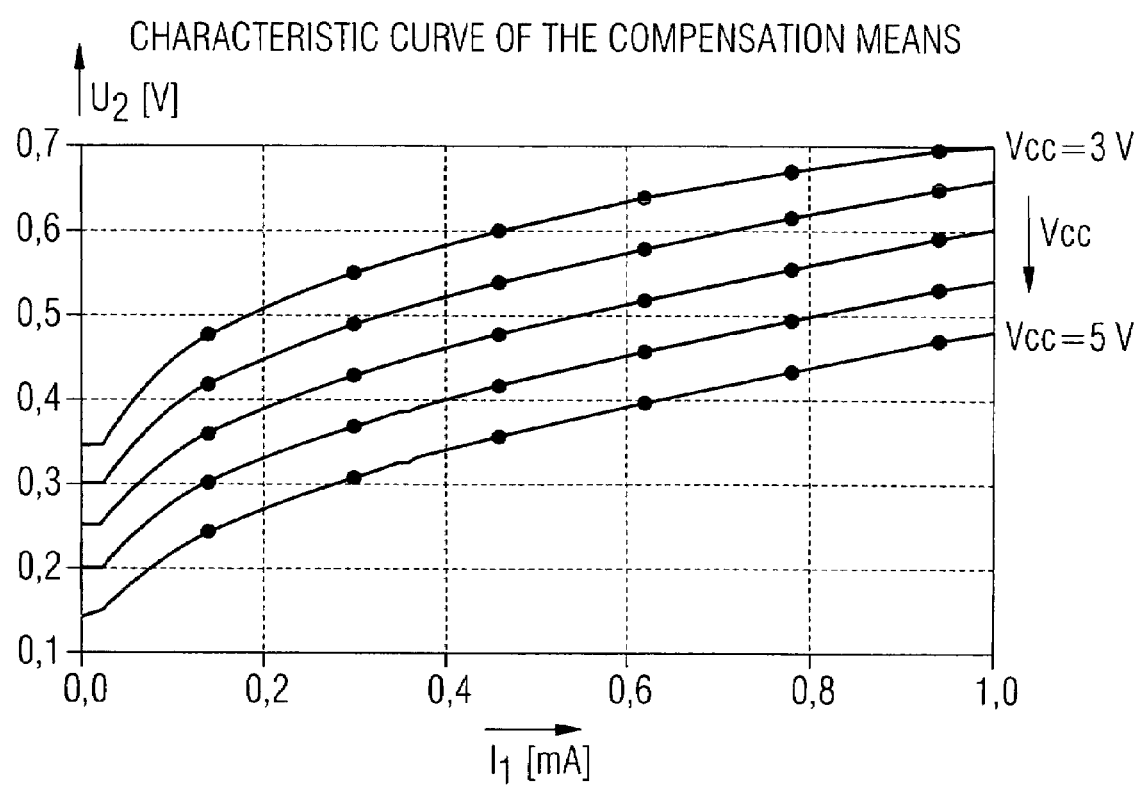
FIG. 4 is a characteristic curve of the compensation means according to a preferred embodiment of the present invention.

FIG. 4 shows a characteristic curve of the compensation means. The working-point control current $I_1$ is plotted along the x axis, namely from 0.0 mA to 1.0 mA. The base operating voltage is plotted in 100 mV steps from 0.1 V to 0.7 V along the y axis. The parameter in the illustration shown in FIG. 4 is the battery operating voltage $V_{CC}$, which is varied from 3 V to 5 V, namely in 0.5 V steps. From FIG. 4 it can be seen that, at the same working-point control current $I_1$, at low battery voltages $V_{CC}$ relatively large base operating voltages are present, which lie close to a UBE voltage drop, whereas at high battery voltages $V_{CC}$ the base operating voltage decreases. At the example of a working-point control current $I_1$ of 0.5 mA, the base operating voltage may be reduced from 0.63 V to 0.39 V with the dimensioning underlying FIG. 4 of the circuit shown in FIG. 2, when the battery voltage rises from 3 V to 5 V, or, conversely, falls from 5 V to 3 V.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCE NUMERAL LIST 10 bipolar power transistor
11 $U_{BE}$ multiplier
12 circuit for reducing the working voltage
13 compensation means
30 signal source
31 coupling capacitor
32 amplifier transistor
32a base
32b collector
32c emitter
33 coupling inductance
34 current source
35 current mirror transistor
36 short line
40 U/I converter
41 converter transistor
42 converter emitter transistor
43 voltage source
44 pnp current mirror
44a first mirror transistor
44b second mirror transistor
46 intermediate node of the $U_{BE}$ multiplier
48 intermediate node of the circuit for reducing
50 coupling inductance
$T_1$ multiplier transistor
$R_5$ first splitter resistor
$R_6$ second splitter resistor
$R_1$ compensation resistor
$I_2$ temperature compensation current source
$T_3$ reducer transistor
$R_3$ first splitter resistor
$R_4$ second splitter resistor
$R_2$ compensation resistor
$I_3$ current source for compensation
$I_0$ reduction current source
$T_2$ emitter follower transistor
$T_4$ bipolar power transistor
$V_{CC}$ supply voltage

What is claimed is:

1. A circuit for providing a base operating voltage for a bipolar transistor, comprising:
   a base-emitter voltage multiplier with a multiplier transistor operable to provide a working voltage as a reaction to a working-point control current at a working point control current terminal, wherein the working voltage is equal to a base-emitter voltage drop of the multiplier transistor multiplied by a voltage amplification factor;
   the multiplier transistor including a base, an emitter, and a collector, wherein the working voltage is provided at the collector, wherein the emitter is connected to a reference potential, and wherein the base is connected to an intermediate node;
   the base-emitter voltage multiplier further comprising a first splitter resistor between the intermediate node and the collector of the multiplier transistor; and a second splitter resistor between the intermediate node and the reference potential; and
   a circuit operable to reduce the working voltage to a base operating voltage for a bipolar transistor, which base operating voltage is smaller than a base-emitter voltage drop of the bipolar transistor, wherein the circuit operable to reduce the working voltage to the base operating voltage comprises an emitter follower transistor operable to buffer the working voltage and operable to reduce the working voltage by a base-emitter voltage drop of the emitter follower transistor,
   wherein the working point control current terminal is connected to the collector of the multiplier transistor and is furthermore connected to a base of the emitter follower transistor, and
   wherein the first splitter resistor and the second splitter resistor are selected such that the voltage amplification factor is greater than or equal to 1.4 and less than or equal to 2.

2. The circuit of claim 1, wherein the base-emitter voltage drop of the bipolar transistor corresponds to a gate voltage of a base-emitter diode of the multiplier transistor, wherein the gate voltage is about 0.6 V; and wherein the multiplier transistor is comprised of silicon.

3. The circuit of claim 1,
   wherein the base-emitter voltage multiplier comprises a working voltage output for outputting the working voltage, and
   wherein the emitter follower transistor comprises a base, an emitter, and a collector, wherein the base is connected to the working voltage output, wherein the base operating voltage is output to the emitter, and wherein a supply voltage is applied to the collector.

4. The circuit of claim 1, further comprising a provider for providing a working-point control current, which includes a voltage-current converter.

5. The circuit of claim 4,
   wherein a voltage input of the voltage-current converter is connected to a digital/analog converter, and wherein a current output is connected to a current mirror circuit to provide the working-point control current.

6. The circuit of claim 1, further comprising a controllable current source between the intermediate node and the reference potential.

7. The circuit of claim 1,
   wherein the current amplification factor is adjustable between 1.4 and 2.

8. The circuit of claim 1, wherein the emitter follower transistor comprises
   an emitter, a base, and a collector, wherein the emitter is connected to a reference potential, wherein the base is connected to an intermediate node, and wherein the base operating voltage is provided at the collector, a first splitter resistor connected between the intermediate node and the collector of the emitter follower transistor, and a second splitter resistor connected between the intermediate node and the reference potential.

9. The circuit of claim 8, further comprising a current source between the intermediate node and the reference potential.

10. The circuit of claim 8, further comprising a current source between the intermediate node and a supply voltage potential.

11. The circuit of claim 1, further comprising:
a compensator operable to decrease the base operating voltage when a supply voltage of the bipolar transistor increases, or operable to increase the base operating voltage when the supply voltage drops.

12. The circuit of claim 1, further comprising a compensator with a resistor between the intermediate node and a supply voltage potential, wherein the base operating voltage is decreased when the supply voltage rises, and wherein the base operating voltage is increased when the supply voltage drops.

13. The circuit of claim 8, further comprising a compensator with a resistor between the intermediate node and a supply voltage potential, wherein the base operating voltage is decreased when the supply voltage rises, and wherein the base operating voltage is increased when the supply voltage drops.

14. The circuit of claim 1,
wherein the bipolar transistor is a bipolar power transistor and the circuit is formed to operate the bipolar power transistor in a class C operation.

15. An amplifier circuit, comprising:
a bipolar transistor with a base, a collector, and an emitter;
a circuit operable to provide a base operating voltage for the bipolar transistor, the circuit comprising:
a base-emitter voltage multiplier with a multiplier transistor operable to provide a working voltage as a reaction to a working-point control current at a working point control current terminal, wherein the working voltage is equal to a base-emitter voltage drop of the multiplier transistor multiplied by a voltage amplification factor;
the multiplier transistor including a base, an emitter, and a collector, wherein the working voltage is provided at the collector, wherein the emitter is connected to a reference potential, and wherein the base is connected to an intermediate node;
the base-emitter voltage multiplier further comprising a first splitter resistor between the intermediate node and the collector of the multiplier transistor; and a second splitter resistor between the intermediate node and the reference potential;
a circuit operable to reduce the working voltage to the base operating voltage, which base operating voltage is smaller than a base-emitter voltage drop of the bipolar transistor, wherein the circuit operable to reduce the working voltage to the base operating voltage comprises an emitter follower transistor operable to buffer the working voltage and operable to reduce the working voltage by a base-emitter voltage drop of the emitter follower transistor;

wherein the working point control current terminal is connected to the collector of the multiplier transistor and is furthermore connected to a base of the emitter follower transistor, and wherein the first splitter resistor and the second splitter resistor are selected such that the voltage amplification factor is greater than or equal to 1.4 and less than or equal to 2, wherein the collector of the bipolar transistor is coupled to a supply voltage, wherein the base of the bipolar transistor is coupled to a signal to be amplified as well as the base operating voltage, wherein the emitter of the bipolar transistor is coupled to a reference voltage potential, and wherein an amplified signal is output at the collector of the bipolar transistor.

16. A method for providing a base operating voltage for a bipolar transistor, the method comprising:

providing a working voltage as a reaction to a working-point control current, at a working point control current, wherein the working voltage is equal to a base-emitter voltage drop of a base-emitter voltage multiplier having a multiplier transistor multiplied by a voltage amplification factor; the multiplier transistor including a base, an emitter, and a collector, wherein the working voltage is provided at the collector, wherein the emitter is connected to a reference potential, and wherein the base is connected to an intermediate node, the base-emitter voltage multiplier further comprising a first splitter resistor between the intermediate node and the collector of the multiplier transistor; and a second splitter resistor between the intermediate node and the reference potential; and reducing the working voltage to produce a base operating voltage for a bipolar transistor, wherein the base operating voltage is smaller than a base-emitter voltage drop of the bipolar transistor, and wherein the step of reducing the working voltage to the base operating voltage includes buffering the working voltage and reducing the working voltage by a base-emitter voltage drop of an emitter follower transistor, wherein the working point control current terminal is connected to the collector of the multiplier transistor and is furthermore connected to a base of the emitter follower transistor, and wherein the first splitter resistor and the second splitter resistor are selected such that the voltage amplification factor is greater than or equal to 1.4 and less than or equal to 2.

17. The method of claim 16 further comprising:
adjusting the voltage amplification factor within the range of 1.4 to 2.

18. The method of claim 16 wherein the base-emitter voltage drop of the bipolar transistor corresponds to a gate voltage of a base-emitter diode of the multiplier transistor.

19. The method of claim 18 wherein the gate voltage is about 0.6 V and wherein the multiplier transistor is comprised of silicon.

* * * * *